(12) United States Patent
Chen et al.

(10) Patent No.: US 10,777,426 B2
(45) Date of Patent: Sep. 15, 2020

(54) SEMICONDUCTOR DEVICE AND FORMATION THEREOF

(71) Applicant: TAIWAN SEMICONDUCTOR MANUFACTURING COMPANY LIMITED, Hsin-Chu (TW)

(72) Inventors: Yen-Ting Chen, Taipei (TW); I-Hsieh Wong, Kaohsiung (TW); Chee-Wee Liu, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 176 days.

(21) Appl. No.: 15/840,039

(22) Filed: Dec. 13, 2017

(65) Prior Publication Data

US 2018/0102258 A1    Apr. 12, 2018

Related U.S. Application Data

(63) Continuation of application No. 14/445,157, filed on Jul. 29, 2014, now Pat. No. 9,847,233.

(51) Int. Cl.
*H01L 21/336* (2006.01)
*H01L 21/324* (2006.01)
*H01L 29/10* (2006.01)
*H01L 29/66* (2006.01)
*H01L 29/78* (2006.01)
(Continued)

(52) U.S. Cl.
CPC ........ *H01L 21/324* (2013.01); *H01L 29/1041* (2013.01); *H01L 29/66666* (2013.01); *H01L 29/785* (2013.01); *H01L 29/7827* (2013.01);
*H01L 29/78642* (2013.01); *H01L 29/78696* (2013.01); *H01L 29/0676* (2013.01)

(58) Field of Classification Search
CPC ........... H01L 29/1037; H01L 29/66666; H01L 29/66712; H01L 29/7827; H01L 29/78642; H01L 29/78696; H01L 29/8083; H01L 27/2454; H01L 21/823487; H01L 21/823885; H01L 21/26586; H01L 29/0676; H01L 29/1041; H01L 29/785; H01L 21/324
See application file for complete search history.

(56) References Cited

U.S. PATENT DOCUMENTS 4,209,349 A * 6/1980 Ho ...................... H01L 21/0337
148/DIG. 116
4,466,175 A * 8/1984 Coe ...................... H01L 29/1095
438/273
(Continued)

*Primary Examiner* — Mary A Wilczewski
(74) *Attorney, Agent, or Firm* — Cooper Legal Group, LLC

(57) ABSTRACT

A semiconductor device and method of formation are provided. The semiconductor device includes a first active region adjacent a channel, the channel, and a second active region adjacent the channel. The channel has a channel doping profile. The channel includes a central channel portion having a first dopant concentration of a first dopant and a radial channel portion surrounding the central channel portion. The radial channel portion has a second dopant concentration of a second dopant greater than the first dopant concentration. The channel comprising the central channel portion and the radial channel portion has increased voltage threshold tuning as compared to a channel that lacks a central channel portion and a radial channel portion.

20 Claims, 7 Drawing Sheets

(51) Int. Cl.
   *H01L 29/786* (2006.01)
   *H01L 29/06* (2006.01)
   *H01L 29/36* (2006.01)

(56) References Cited

U.S. PATENT DOCUMENTS

| | | | | |
|---|---|---|---|---|
| 4,521,795 A * | 6/1985 | Coe | H01L 29/0696 | 257/341 |
| 4,530,149 A * | 7/1985 | Jastrzebski | H01L 21/28 | 257/E21.131 |
| 4,702,797 A * | 10/1987 | Shimano | H01L 27/10805 | 438/252 |
| 4,783,693 A * | 11/1988 | Alzati | G11B 5/022 | 257/477 |
| 4,829,017 A * | 5/1989 | Malhi | H01L 27/10841 | 257/302 |
| 4,903,189 A * | 2/1990 | Ngo | H01L 29/7722 | 257/331 |
| 5,072,266 A * | 12/1991 | Bulucea | H01L 29/0696 | 257/330 |
| 5,208,172 A * | 5/1993 | Fitch | H01L 21/823487 | 257/E21.41 |
| 5,252,849 A * | 10/1993 | Fitch | H01L 21/8221 | 257/329 |
| 5,293,053 A * | 3/1994 | Malhi | H01L 27/0688 | 257/330 |
| 5,308,782 A * | 5/1994 | Mazure | H01L 21/8221 | 438/154 |
| 5,324,673 A * | 6/1994 | Fitch | H01L 21/28525 | 257/329 |
| 5,398,200 A * | 3/1995 | Mazure | H01L 21/76897 | 257/296 |
| 5,460,988 A * | 10/1995 | Hong | H01L 27/11556 | 257/315 |
| 5,612,563 A * | 3/1997 | Fitch | H01L 21/76897 | 257/329 |
| 5,627,390 A * | 5/1997 | Maeda | H01L 21/84 | 257/302 |
| 5,675,166 A * | 10/1997 | Ilderem | H01L 29/0847 | 257/345 |
| 5,814,858 A * | 9/1998 | Williams | H01L 29/7828 | 257/328 |
| 5,955,746 A * | 9/1999 | Kim | H01L 27/1104 | 257/336 |
| 5,981,344 A * | 11/1999 | Hshieh | H01L 29/66712 | 438/270 |
| 6,084,268 A * | 7/2000 | de Fresart | H01L 29/7813 | 257/342 |
| 6,107,133 A * | 8/2000 | Furukawa | H01L 27/10867 | 257/E21.652 |
| 6,177,699 B1 * | 1/2001 | Perng | H01L 21/76237 | 257/303 |
| 6,177,708 B1 * | 1/2001 | Kuang | H01L 27/1203 | 257/288 |
| 6,268,621 B1 * | 7/2001 | Emmi | H01L 21/84 | 257/302 |
| 6,294,418 B1 * | 9/2001 | Noble | H01L 21/823885 | 257/E21.429 |
| 6,346,726 B1 * | 2/2002 | Herman | H01L 27/088 | 257/327 |
| 6,580,124 B1 * | 6/2003 | Cleeves | H01L 29/40117 | 257/331 |
| 6,713,351 B2 * | 3/2004 | Blanchard | H01L 29/7813 | 438/270 |
| 7,825,455 B2 * | 11/2010 | Lee | H01L 23/528 | 257/315 |
| 8,835,270 B2 * | 9/2014 | Nandakumar | H01L 29/66477 | 438/306 |
| 8,890,119 B2 * | 11/2014 | Doyle | H01L 29/42376 | 257/24 |
| 9,136,378 B2 * | 9/2015 | Okumura | H01L 29/7802 | |
| 9,530,700 B1 * | 12/2016 | Mallela | H01L 27/0924 | |
| 9,640,531 B1 * | 5/2017 | Or-Bach | H01L 27/0688 | |
| 9,685,537 B1 * | 6/2017 | Xie | H01L 29/66666 | |
| 9,799,777 B1 * | 10/2017 | Balakrishnan | H01L 29/7889 | |
| 9,847,233 B2 * | 12/2017 | Chen | H01L 21/324 | |
| 2003/0052721 A1 * | 3/2003 | Chaudhry | H01L 21/82285 | 327/242 |
| 2004/0256683 A1 * | 12/2004 | Lee | H01L 21/823412 | 257/412 |
| 2005/0019993 A1 * | 1/2005 | Lee | H01L 29/42384 | 438/157 |
| 2005/0164438 A1 * | 7/2005 | Okonogi | H01L 21/2253 | 438/197 |
| 2006/0249783 A1 * | 11/2006 | Lojek | H01L 29/42332 | 257/327 |
| 2007/0023839 A1 * | 2/2007 | Furukawa | B82Y 10/00 | 257/353 |
| 2007/0148939 A1 * | 6/2007 | Chu | H01L 29/7781 | 438/590 |
| 2007/0241367 A1 * | 10/2007 | Ouyang | H01L 29/778 | 257/190 |
| 2008/0012066 A1 * | 1/2008 | Lin | H01L 21/823487 | 257/329 |
| 2008/0049486 A1 * | 2/2008 | Gruening-von Schwerin | G11C 13/0023 | 365/104 |
| 2008/0315282 A1 * | 12/2008 | Cho | H01L 23/485 | 257/315 |
| 2009/0065857 A1 * | 3/2009 | Lin | H01L 21/823487 | 257/329 |
| 2009/0181502 A1 * | 7/2009 | Parikh | H01L 29/1606 | 438/164 |
| 2010/0252800 A1 * | 10/2010 | Chidambarrao | B82Y 10/00 | 257/9 |
| 2010/0295119 A1 * | 11/2010 | Sandhu | H01L 29/7827 | 257/329 |
| 2013/0032812 A1 * | 2/2013 | Kizilyalli | H01L 21/8252 | 257/76 |
| 2013/0049120 A1 * | 2/2013 | Sandhu | B82Y 10/00 | 257/365 |
| 2013/0153917 A1 * | 6/2013 | Romano | H01L 29/66924 | 257/76 |
| 2013/0320453 A1 * | 12/2013 | Pethe | H01L 29/7854 | 257/368 |
| 2014/0138744 A1 * | 5/2014 | Kotlyar | H01L 29/785 | 257/192 |
| 2014/0166981 A1 * | 6/2014 | Doyle | H01L 21/0237 | 257/24 |
| 2014/0166983 A1 * | 6/2014 | Cohen | H01L 29/66484 | 257/29 |
| 2015/0061013 A1 * | 3/2015 | Basu | H01L 29/785 | 257/347 |
| 2015/0132899 A1 * | 5/2015 | Kizilyalli | H01L 21/8252 | 438/192 |
| 2015/0228794 A1 * | 8/2015 | Hsiao | H01L 29/7853 | 257/401 |
| 2015/0279933 A1 * | 10/2015 | Xiao | H01L 21/2252 | 257/400 |
| 2016/0035886 A1 * | 2/2016 | Chen | H01L 21/324 | 257/329 |
| 2016/0163856 A1 * | 6/2016 | Doyle | H01L 29/66666 | 257/191 |
| 2016/0190137 A1 * | 6/2016 | Tsai | H01L 27/0924 | 257/369 |
| 2016/0211326 A1 * | 7/2016 | Tsai | H01L 29/1037 | |
| 2016/0268256 A1 * | 9/2016 | Yang | H01L 27/088 | |
| 2018/0102258 A1 * | 4/2018 | Chen | H01L 21/324 | |
| 2019/0334024 A1 * | 10/2019 | Jiang | H01L 21/0254 | |

* cited by examiner

SEMICONDUCTOR DEVICE AND FORMATION THEREOF

RELATED APPLICATION

This application claims priority to and is a divisional of U.S. patent application Ser. No. 14/445,157, titled "SEMICONDUCTOR DEVICE AND FORMATION THEREOF" and filed on Jul. 29, 2014, which is incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
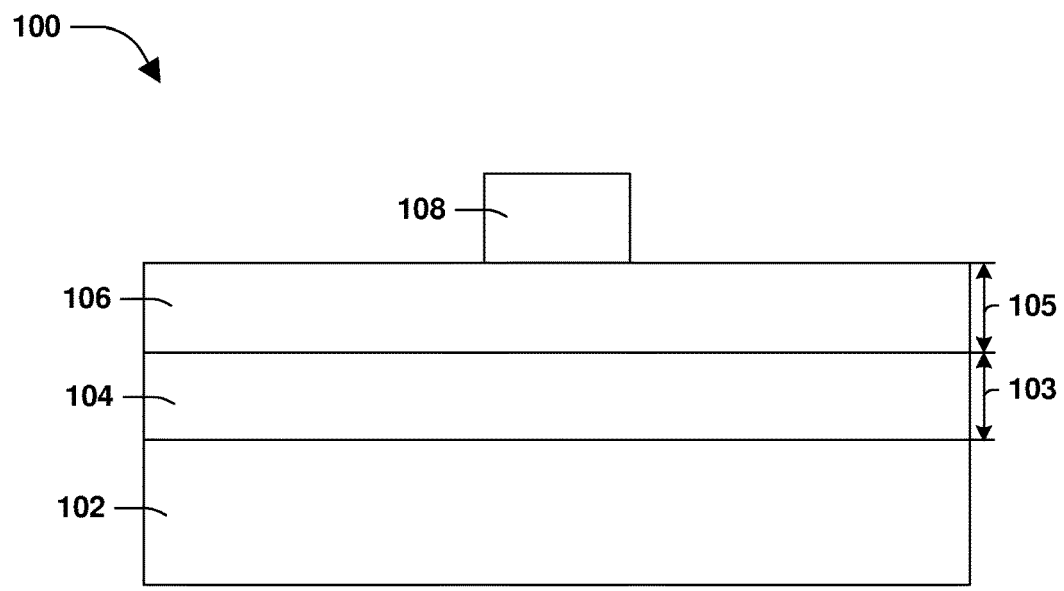
FIG. 1 is an illustration of a semiconductor device at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein. Some embodiments of the present disclosure have one or a combination of the following features and/or advantages.

According to some embodiments, a semiconductor device comprises a first active region adjacent a channel, the channel, and a second active region adjacent the channel. In some embodiments, the channel has a channel doping profile. In some embodiments, the channel doping profile comprises at least one of a step doping profile, a linear doping profile or a Gaussian doping profile. In some embodiments, the channel comprises a central channel portion and a radial channel portion surrounding the central channel portion. In some embodiments, a radial channel width of the radial channel portion divided by a central channel width of the central channel portion is between about 0.05 to about 5. In some embodiments, the central channel portion has the central channel width between about 1 nm to about 15 nm. In some embodiments, the radial channel portion has the radial channel width between about 3 nm to about 20 nm. In some embodiments, the central channel portion has a first dopant concentration of a first dopant. In some embodiments, the radial channel portion has a second dopant concentration of a second dopant. In some embodiments, the first dopant concentration is between about $0.5 \times 10^{16}$ cm$^{-3}$ to about $1.0 \times 10^{20}$ cm$^{-3}$ of the first dopant. In some embodiments, the second dopant concentration is greater than the first dopant concentration. In some embodiments, the second dopant concentration is between about $1.0 \times 10^{16}$ cm$^{-3}$ to about $2.0 \times 10^{20}$ cm$^{-3}$ of the second dopant. In some embodiments, at least one of the first dopant or the second dopant comprises phosphorus. In some embodiments, a gate surrounds the channel.

According to some embodiments, a method of forming the semiconductor device comprises forming a first column over the first active region. In some embodiments, a doped layer is formed over the first column. In some embodiments, the doped layer is grown over the first column. In some embodiments, the doped layer is deposited over the first column. In some embodiments, the doped layer comprises the second dopant. In some embodiments, the channel is formed from at least some of the first column and at least some of the doped layer by performing a thermal process. In some embodiments, forming the channel comprises forming the central channel portion. In some embodiments, the central portion comprises at least some of the first column. In some embodiments, the central portion has the first dopant concentration. In some embodiments, forming the channel comprises forming the radial channel portion surrounding the central channel portion. In some embodiments, the radial channel portion comprises at least one of the doped layer or at least some of the first column. In some embodiments, the radial channel portion has the second dopant concentration of the second dopant. In some embodiments, a second active region is formed over and in contact with the channel. In some embodiments, forming the second active region comprises growing at least one of silicon, germanium, an n-type dopant or a p-type dopant. In some embodiments, the central channel portion increases depletion in the channel and improves a substrate slope junction as compared to a channel that lacks a central channel portion. In some embodiments, the channel comprising the central channel portion improves electrostatic control as compared to a channel that lacks a central channel portion. In some embodiments, the channel comprising the central channel portion and the radial channel portion has increased voltage threshold tuning as compared to a channel that lacks a central channel portion and a radial channel portion. In some embodiments, a voltage threshold is adjustable by at least one of increasing or decreasing the central channel width. In some embodiments, increased voltage threshold tuning reduces peak power or ground bouncing noise.

FIGS. 1-9 are cross-sectional views of a semiconductor device 100, at various stages of fabrication. Turning to FIG. 1, a source layer 104 is formed over a substrate 102, according to some embodiments. In some embodiments, the substrate 102 comprises at least one of silicon, germanium, etc. In some embodiments, the substrate 102 includes at least one of an epitaxial layer, a silicon-on-insulator (SOI) structure, a wafer, a die formed from a wafer, etc. In some embodiments, forming the source layer 104 comprises growing a layer comprising at least one of silicon, germanium, an n-type dopant, a p-type dopant, etc. In some embodiments, the source layer 104 has a source thickness 103 between about 30 nm to about 70 nm. In some embodiments, a column layer 106 is formed over the source layer 104. In some embodiments, the column layer 106 comprises an initial dopant concentration of a first dopant. In some embodiments, the first dopant comprises at least one of a group III material, a group IV material, etc. In some embodiments, the first dopant comprises phosphorus. In some embodiments, the column layer 106 comprises at least one of silicon, germanium, etc. In some embodiments, the column layer 106 has a column layer thickness 105 between about 5 nm to about 35 nm. In some embodiments, a photoresist 108 is formed over the column layer 106, such that a portion of the column layer 106 is covered by the photoresist 108.

Figure 2:
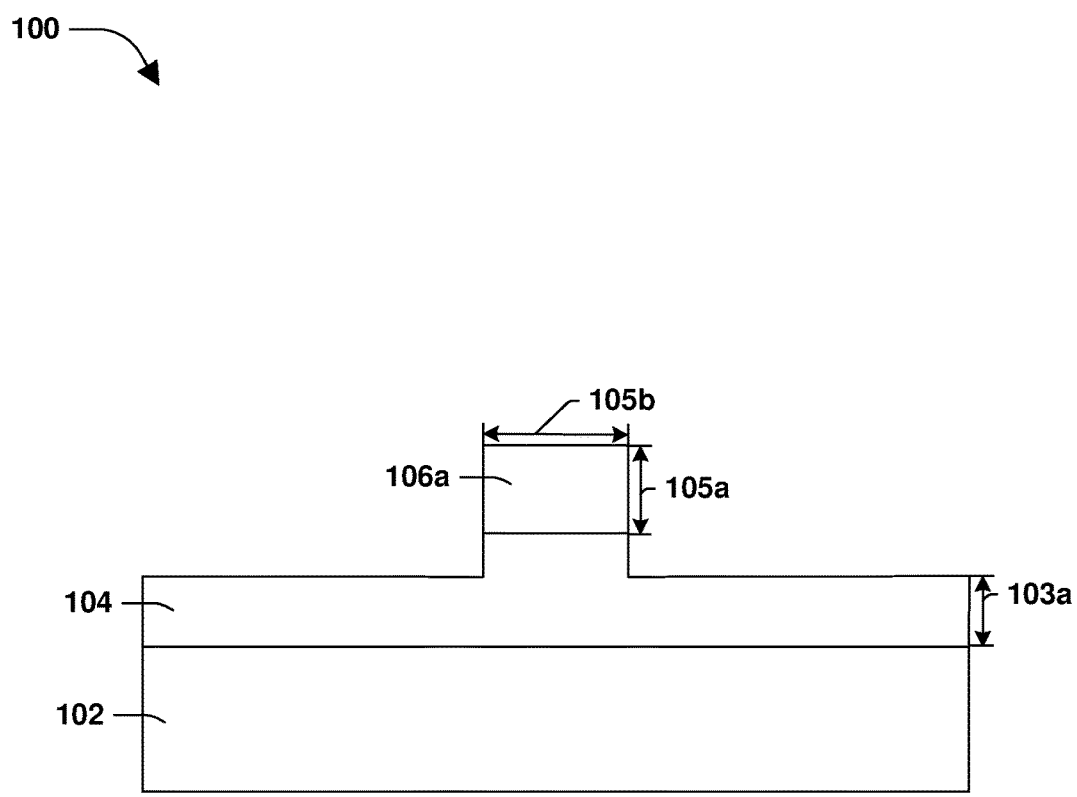
FIG. 2 is an illustration of a semiconductor device at a stage of fabrication, in accordance with some embodiments.

Turning to FIG. 2, a first column 106a is formed form the column layer 106, according to some embodiments. In some embodiments, the first column 106a is formed by etching. In some embodiments, the first column 106a has a column height 105a and a column width 105b. In some embodiments, the column height 105a is between about 5 nm to about 35 nm. In some embodiments, the column width 105b is between about 1 nm to about 15 nm. In some embodiments, the etching removes at least some of the source layer 104. In some embodiments, after the etching the source layer 104 has a recessed source thickness 103a between about 15 nm to about 55 nm. In some embodiments, after the etching the photoresist 108 is removed.

Figure 3:
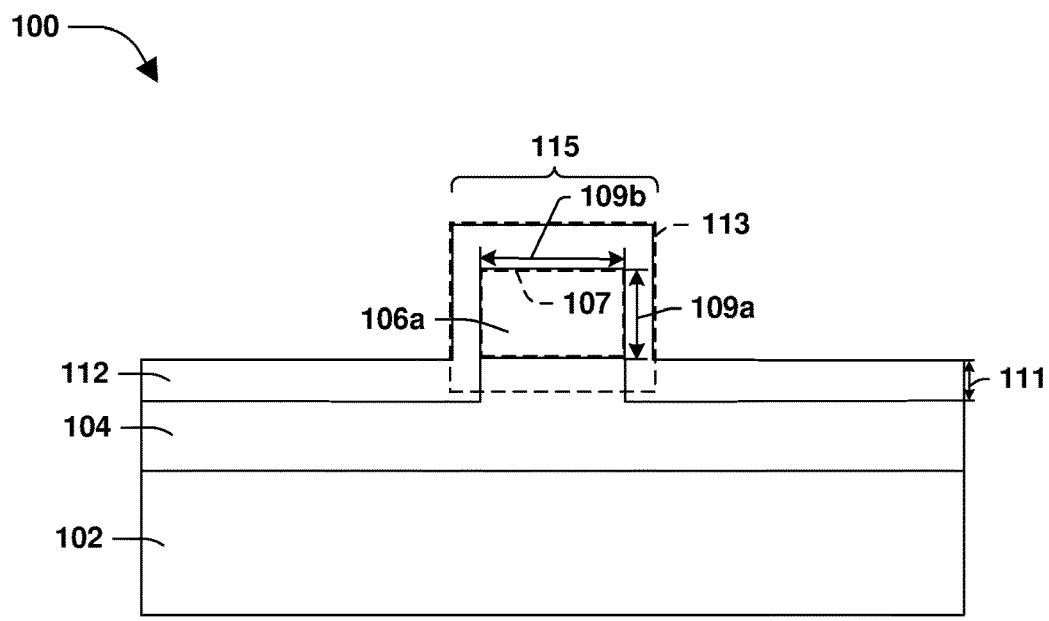
FIG. 3 is an illustration of a semiconductor device at a stage of fabrication, in accordance with some embodiments.

Turning to FIG. 3, a doped layer 112 is formed over the source layer 104 and the first column 106a, according to some embodiments. In some embodiments, the doped layer 112 is epitaxially grown. In some embodiments, the first column 106a comprises a central channel portion 107 of a channel 115. In some embodiments, at least some of the doped layer 112 and at least some of the source layer 104 comprise a radial channel portion 113 of the channel 115. In some embodiments, the doped layer 112 has a doped layer thickness 111 between about 2 nm to about 19 nm. In some embodiments, a central channel height 109a of the central channel portion 107 is between about 5 nm to about 35 nm. In some embodiments, a central channel width 109b of the central channel portion 107 is between about 1 nm to about 15 nm. In some embodiments, the central channel portion 107 has a first dopant concentration of the first dopant. In some embodiments, the initial dopant concentration is equal to the first dopant concentration. In some embodiments, the doped layer 112 comprises a second dopant concentration of a second dopant. In some embodiments, the radial channel portion 113 comprised of the doped layer 112 has the second dopant concentration of the second dopant. In some embodiments, the first dopant concentration is between about $0.5 \times 10^{16}$ cm$^{-3}$ to about $1.0 \times 10^{20}$ cm$^{-3}$ of the first dopant. In some embodiments, the second dopant concentration is greater than the first dopant concentration. In some embodiments, the second dopant concentration is between about $1.0 \times 10^{16}$ cm$^{-3}$ to about $2.0 \times 10^{20}$ cm$^{-3}$ of the second dopant. In some embodiments, the second dopant comprises at least one of a group III material, a group V material, etc. In some embodiments, at least one of the first dopant or the second dopant comprises phosphorus.

Figure 4:
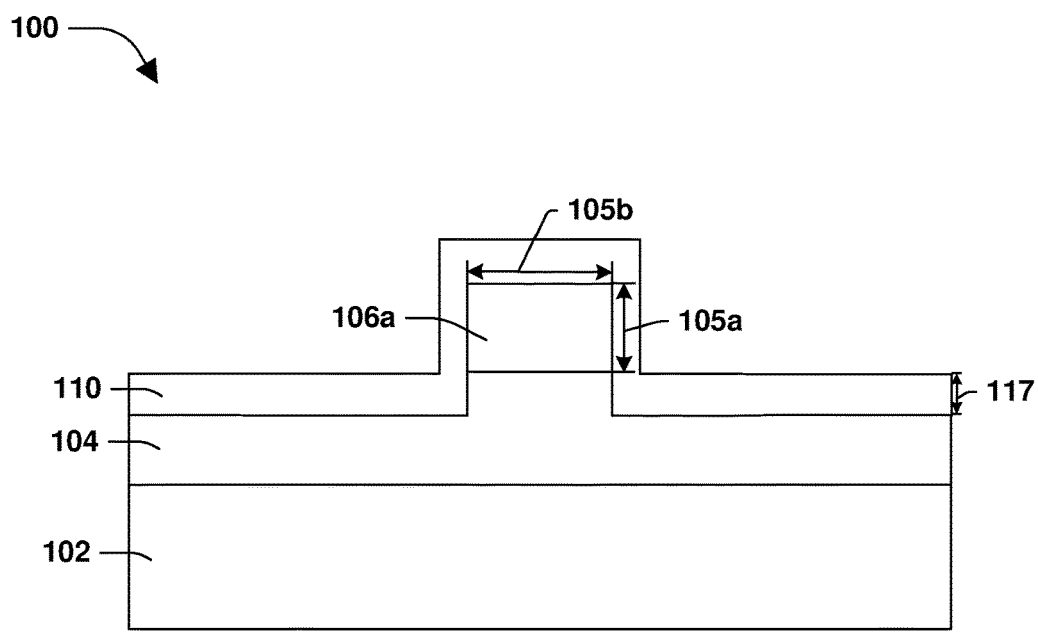
FIG. 4 is an illustration of a semiconductor device at a stage of fabrication, in accordance with some embodiments.

Turning to FIG. 4, an alternate method of forming the channel 115 is illustrated, according to some embodiments. In some embodiments, a highly doped layer 110 is formed over the source layer 104 and the first column 106a. In some embodiments, the highly doped layer 110 is deposited by at least one of atomic layer deposition (ALD, chemical vapor deposition (CVD), physical vapor deposition (PVD), etc. In some embodiments, the highly doped layer 110 is formed at a highly doped temperature between about 300° C. to about 500° C. for a highly doped duration between about 1 min to about 55 min. In some embodiments, the highly doped layer 110 is formed at a highly doped pressure between about 5 torr to about 15 torr. In some embodiments, the highly doped layer 110 has a highly doped thickness 117 between about 1 nm to about 15 nm.

Figure 5:
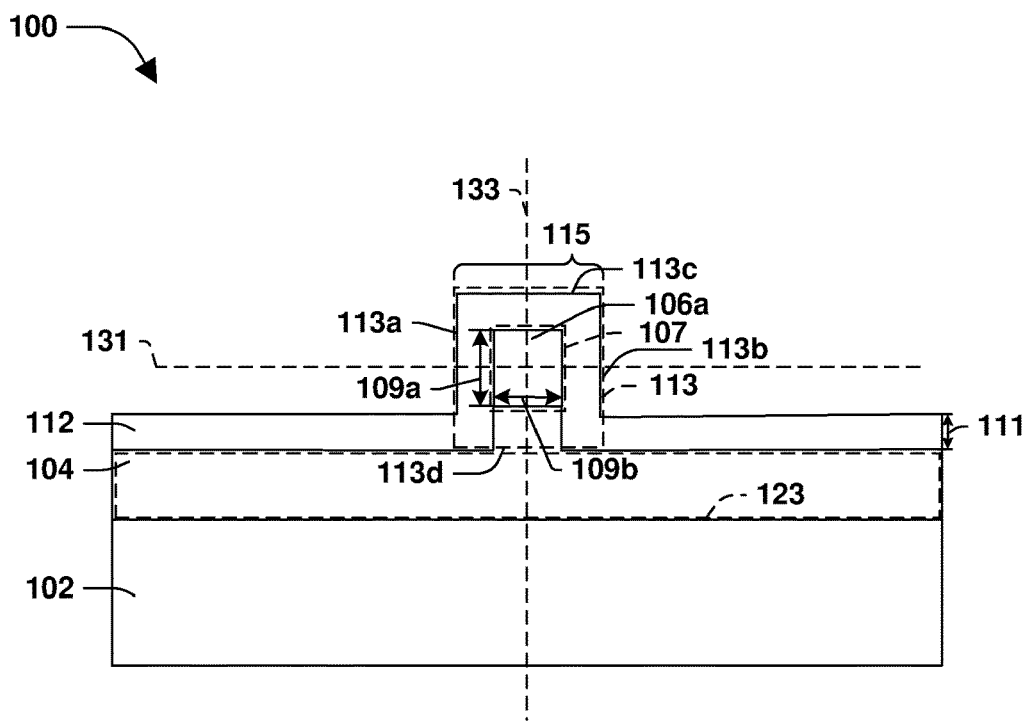
FIG. 5 is an illustration of a semiconductor device at a stage of fabrication, in accordance with some embodiments.

Turning to FIG. 5, a thermal process is performed to form the doped layer 112 from the highly doped layer 110 and at least some of the source layer 104 and the first column 106a, according to some embodiments. In some embodiments, the thermal process comprises applying a first gas comprising nitrogen gas at a thermal flow rate between about 1 sccm to about 100 sccm. In some embodiments, the thermal process occurs for a first duration between 1 sec to about 75 min at a first temperature between about 400° C. to about 800° C. In some embodiments, the thermal operation occurs at a first pressure between about 690 torr to about 830 torr.

According to some embodiments, the first column 106a comprises the central channel portion 107 of the channel 115. In some embodiments, the radial channel portion 113 of the channel 115 comprises at least some of the doped layer 112 and at least some of the source layer 104. In some embodiments, the doped layer 112 has the doped layer thickness 111. In some embodiments, the central channel portion 107 has the central channel height 109a. In some embodiments, the central channel portion 107 has a central channel width 109b. In some embodiments, the central channel width 109b is smaller than the channel width 109b because the doped layer 112 is formed by doping a portion of the first column 106a rather than forming the doped layer 112 over the first column 106a. In some embodiments, the central channel width 109b of the central channel portion 107 is between about 1 nm to about 15 nm. In some embodiments, a portion 123 of the source layer 104 that is not part of the radial channel portion 113 comprises a first active region. In some embodiments, the first active region comprises at least one of a source or a drain.

According to some embodiments, the central channel portion 107 has the first dopant concentration of the first dopant. In some embodiments, the doped layer 112 comprises the second dopant concentration of the second dopant. In some embodiments, the radial channel portion 113 comprised of the doped layer 112 has the second dopant concentration of the second dopant. In some embodiments, at least one of the central channel portion 107 or the radial channel portion 113 comprises a horizontal gradient, where the horizontal gradient is measured from at least one of left to right, or right to left on the page. In some embodiments, the horizontal gradient comprises a decrease in at least one of the first dopant concentration or the second dopant concentration as measured from at least one of a first sidewall 113a of the radial channel portion 113 to a vertical midline 133 of the central channel portion 107 or from a second sidewall 113b of the radial channel portion 113 to the vertical midline 133 of the central channel portion 107. In some embodiments, at least one of the first dopant concentration or the second dopant concentration minimum is at the vertical midline 133.

In some embodiments, at least one of the central channel portion 107 or the radial channel portion 113 comprises a vertical gradient, where the vertical gradient is measured from at least one of top to bottom, or bottom to top on the page. In some embodiments, the vertical gradient comprises a decrease in at least one of the first dopant concentration or the second dopant concentration as measured from at least one of a top surface 113c of the radial channel portion 113 to a horizontal midline 131 of the central channel portion 107 or a bottom surface 113d of the radial channel portion 113 to the horizontal midline 131 of the central channel portion 107. In some embodiments, at least one of the first dopant concentration or the second dopant concentration minimum is at the horizontal midline 131. In some embodiments, the channel 115 has a channel doping profile comprising at least one of the horizontal gradient or the vertical gradient. In some embodiments, the channel doping profile comprising at least one of a step doping profile, a linear doping profile or a Gaussian doping profile. In some embodiments, the doping profile is controlled by altering at least one of the thermal pressure, thermal temperature, thermal duration, thermal gas, or thermal flow rate.

Figure 6:
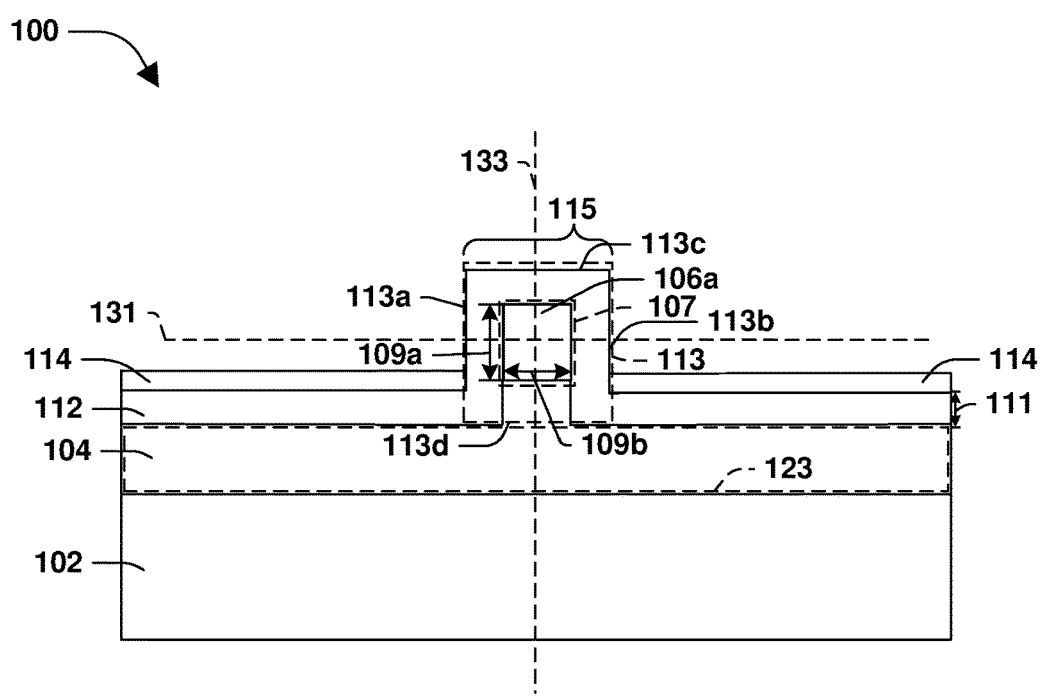
FIG. 6 is an illustration of a semiconductor device at a stage of fabrication, in accordance with some embodiments.

Turning to FIG. 6, an insulating layer 114 is formed over at least some of the doped layer 112, according to some embodiments. In some embodiments, the insulating layer 114 is in contact with at least some of the first sidewall 113a and at least some of the second sidewall 113b. In some embodiments, the top surface 113c and at least some of the first sidewall 113a and the second sidewall 113b are not covered by the insulating layer 114. In some embodiments, the insulating layer 114 is at least one of grown, deposited, etc. In some embodiments, the insulating layer 114 is formed by at least one of ALD, PVD, CVD, etc. In some embodiments, the insulating layer 114 comprises a high dielectric constant material. In some embodiments, the high dielectric constant material comprises at least one of oxide, nitride, etc.

Figure 7:
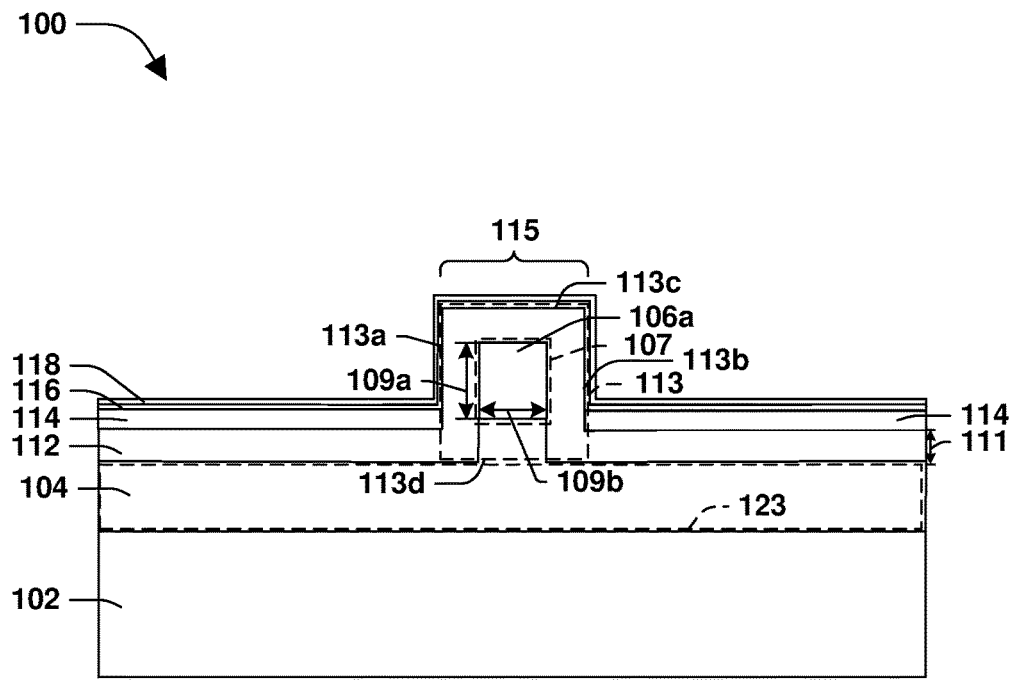
FIG. 7 is an illustration of a semiconductor device at a stage of fabrication, in accordance with some embodiments.

Turning to FIG. 7, a gate dielectric layer 116 is formed over the insulating layer 114, the top surface 113c and the exposed portions of the first sidewall 113a and the second sidewall 113b, according to some embodiments. In some embodiments, the gate dielectric layer 116 comprises a high dielectric constant material. In some embodiments, the gate dielectric layer 116 is at least one of grown, deposited, etc. In some embodiments, the gate dielectric layer 116 is formed by at least one of ALD, PVD, CVD, etc. In some embodiments, the gate dielectric layer 116 comprises at least one of oxide, nitride, etc. In some embodiments, a gate electrode 118 is formed over the gate dielectric layer 116. In some embodiments, the gate electrode 118 comprises a conductive material. In some embodiments, the gate electrode 118 comprises at least one of metal, metalloid, etc. In some embodiments, the gate electrode 118 is at least one of grown, deposited, etc. In some embodiments, the gate electrode 118 is formed by at least one of ALD, PVD, CVD, etc.

Figure 8:
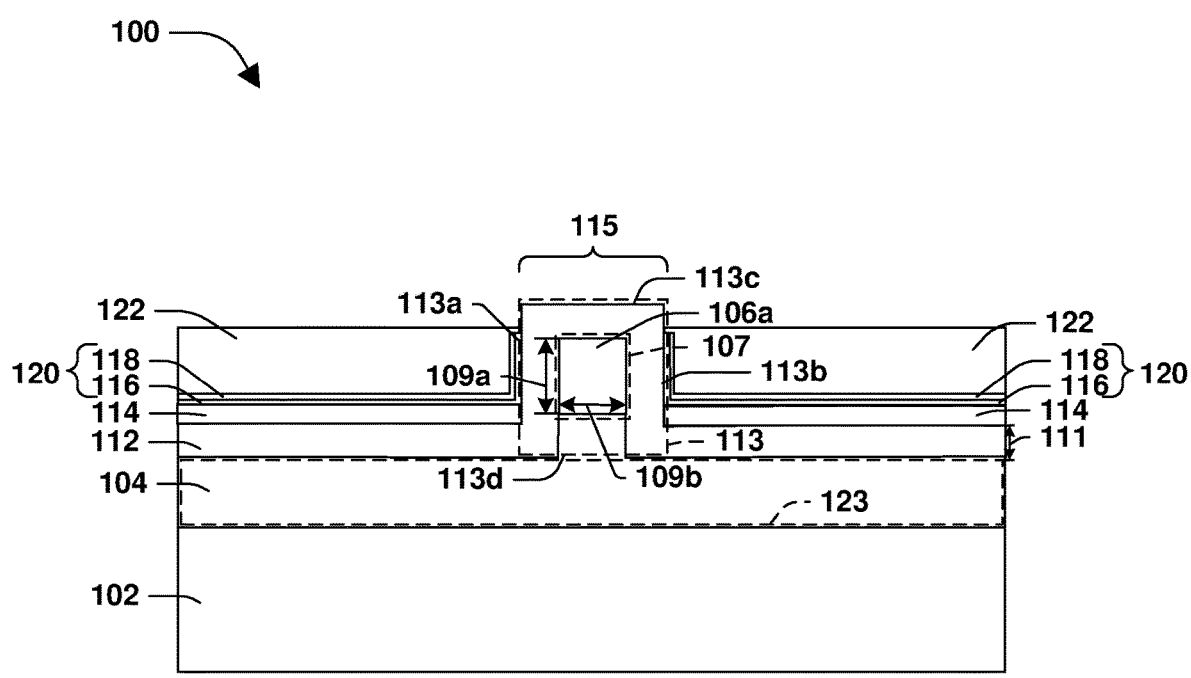
FIG. 8 is an illustration of a semiconductor device at a stage of fabrication, in accordance with some embodiments.

Turning to FIG. 8, the gate electrode 118 and the gate dielectric layer 116 are removed from the top surface 113c of the radial channel portion 113 to form a gate 120 surrounding the channel 115, according to some embodiments. In some embodiments, the gate electrode 118 and the gate dielectric layer 116 are removed from at least some of the first sidewall 113a and at least some of the second sidewall 113b. In some embodiments, the gate 120 comprises the gate electrode 118 and the gate dielectric layer 116. In some embodiments, a second insulating layer 122 is formed over the gate electrode 118 and the gate dielectric layer 116. In some embodiments, the second insulating layer 122 is at least one of grown, deposited, etc. In some embodiments, the second insulating layer 122 is formed by at least one of ALD, PVD, CVD, etc. In some embodiments, the second insulating layer 122 comprises a high dielectric constant material. In some embodiments, the second insulating layer 122 comprises at least one of oxide, nitride, etc.

Figure 9:
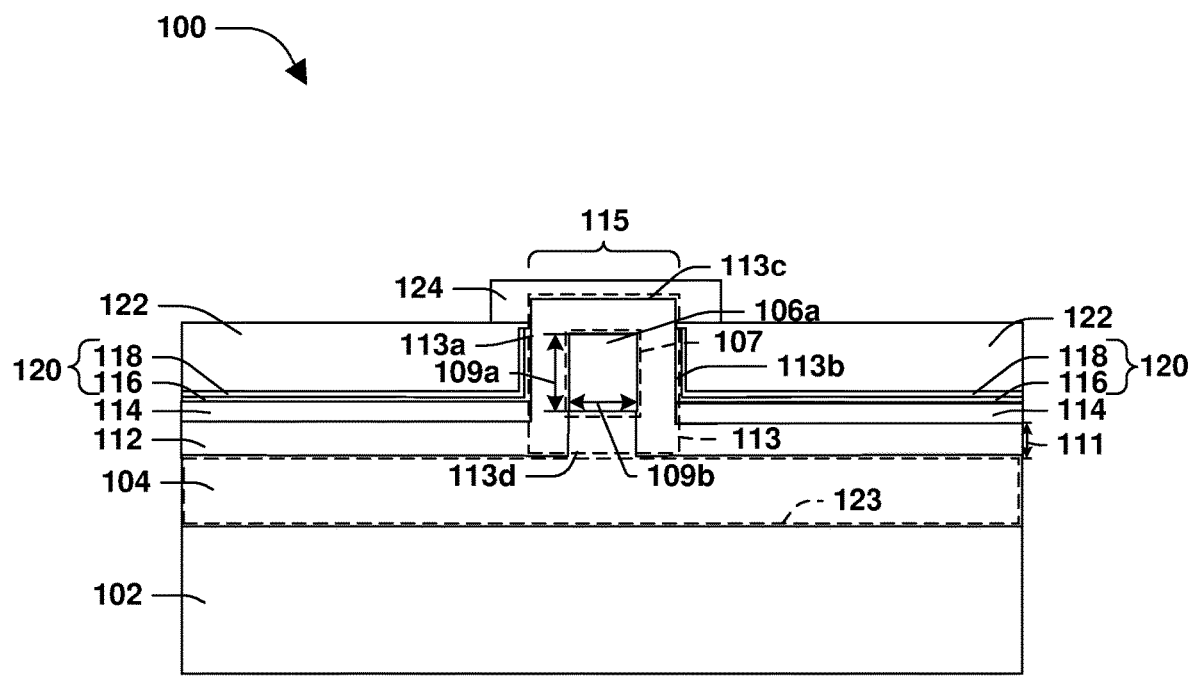
FIG. 9 is an illustration of a semiconductor device at a stage of fabrication, in accordance with some embodiments.

Turning to FIG. 9, a second active region 124 is formed over the top surface 113c of the radial channel portion 113 of the channel 115, according to some embodiments. In some embodiments, the second active region 124 is formed over at least some of the second insulating layer 122. In some embodiments, the second active region 124 comprises at least one of a source or a drain. In some embodiments, forming the second active region 124 comprises growing a layer comprising at least one of silicon, germanium, an n-type dopant, a p-type dopant, etc. In some embodiments, the second active region 124 has a second active thickness between about 30 nm to about 70 nm. In some embodiments, the first active region, the channel 115, and the second active region 124 form a transistor. In some embodiments, the channel 115 is formed in conjunction with at least one of double gate field effect transistor (FET), a FinFET, a trigate, a nanowire FET, etc.

Figure 10:
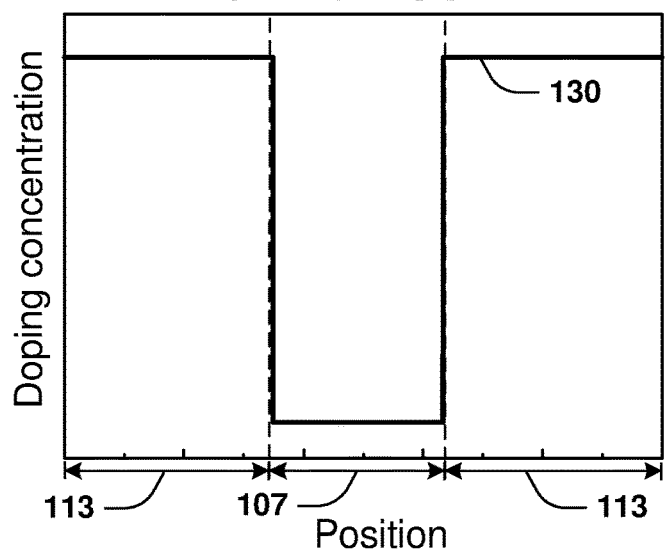
FIG. 10 is an illustration of a graph illustrating a dopant concentration curve, in accordance with some embodiments.

Turning to FIG. 10, a first graph illustrating the step doping profile is illustrated, according to some embodiments. In some embodiments, a dopant concentration is on the y-axis and a position on the channel 115 relative to the central channel portion 107 and the radial channel portion 113 is on the x-axis. In some embodiments, the dopant concentration includes at least one of the first dopant concentration or the second dopant concentration. In some embodiments, the dopant concentration increases moving up the y-axis away from the x-axis. In some embodiments, moving from left to right on the page corresponds to at least one of moving from left to right or moving from top to bottom across the channel 115 in FIGS. 3 and 5-9 such that a step doping profile line 130 is initially high in the radial channel portion 113, abruptly changes to a lower dopant concentration in the central channel portion 107, and then abruptly goes high again in the radial channel portion 113. In some embodiments, the step doping profile line 130 represents at least one of the horizontal gradient or the vertical gradient.

Figure 11:
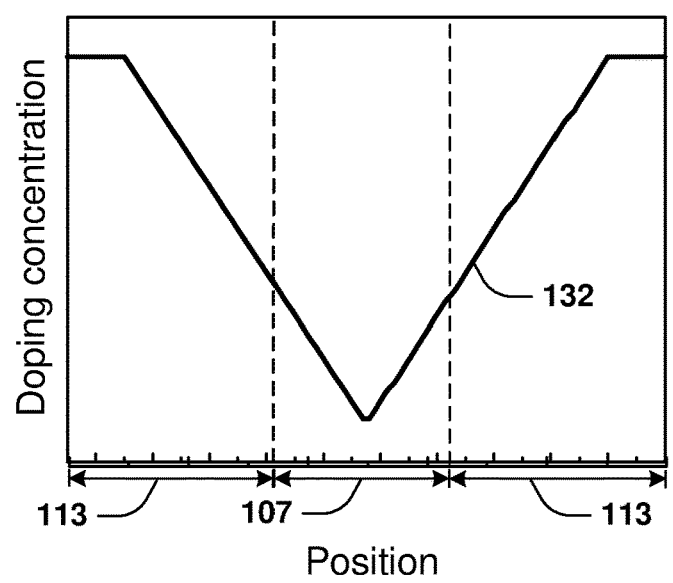
FIG. 11 is an illustration of a graph illustrating a dopant concentration curve, in accordance with some embodiments.

Turning to FIG. 11, a second graph illustrating the linear doping profile is illustrated, according to some embodiments. In some embodiments, the dopant concentration is on the y-axis and a position on the channel 115 relative to the central channel portion 107 and the radial channel portion 113 is on the x-axis. In some embodiments, the dopant concentration includes at least one of the first dopant concentration or the second dopant concentration. In some embodiments, the dopant concentration increases moving up the y-axis away from the x-axis. In some embodiments, moving from left to right on the page corresponds to at least one of moving from left to right or moving from top to bottom across the channel 115 in FIGS. 3 and 5-9 such that a linear doping profile line 132 is initially high in the radial channel portion 113, decreases at a substantially constant slope moving from the radial channel portion 113 to the central channel portion 107, reaches an inflection point about halfway through the central channel portion 107, increases at a substantially constant slope moving from the central channel portion 107 to the radial channel portion 113, and then goes high again in the radial channel portion 113. In some embodiments, a line having a substantially constant slope is represented generally by the equation (1) below.

$$y=mx \quad (1)$$

In some embodiments, y equals the value of the linear doping profile line 132 on the y-axis, x equals the value of the linear doping profile line 132 on the x-axis, and m equals the slope of the linear doping profile line 132. In some embodiments, the linear doping profile line 132 represents at least one of the horizontal gradient or the vertical gradient.

Figure 12:
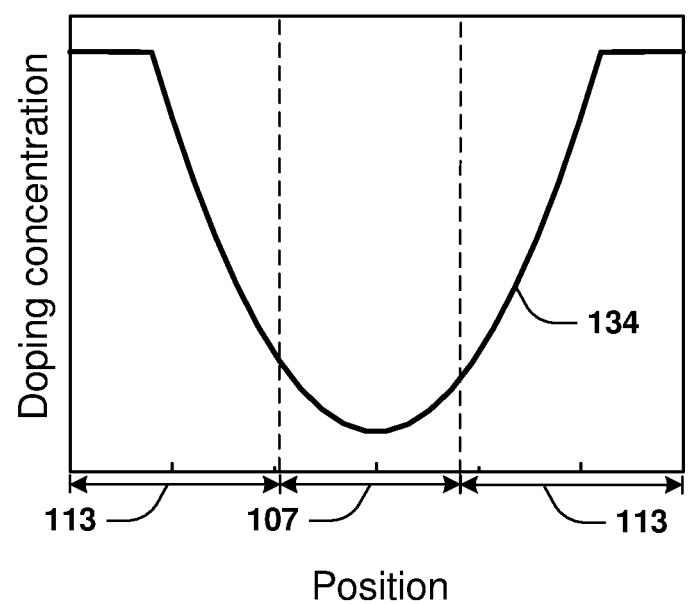
FIG. 12 is an illustration of a graph illustrating a dopant concentration curve, in accordance with some embodiments.

Turning to FIG. 12, a third graph illustrating the Gaussian doping profile is illustrated, according to some embodiments. In some embodiments, the dopant concentration is on the y-axis and a position on the channel 115 relative to the central channel portion 107 and the radial channel portion 113 is on the x-axis. In some embodiments, the dopant concentration includes at least one of the first dopant concentration or the second dopant concentration. In some embodiments, the dopant concentration increases moving up the y-axis away from the x-axis. In some embodiments, moving from left to right on the page corresponds to at least one of moving from left to right or moving from top to bottom across the channel 115 in FIGS. 3 and 5-9 such that a Gaussian doping profile line 134 is initially high in the radial channel portion 113, decreases exponentially moving from the radial channel portion 113 to the central channel portion 107, reaches an inflection point about halfway through the central channel portion 107, increases exponentially moving from the central channel portion 107 to the radial channel portion 113, and then goes high again in the radial channel portion 113. In some embodiments, a line changing exponentially is represented generally by equation 2 below.

$$y=1/x^2 \quad (2)$$

In some embodiments, y equals the value of the Gaussian doping profile line 134 on the y-axis, and x equals the value of the Gaussian doping profile line 134 on the x-axis. In some embodiments, the Gaussian doping profile line 134 represents at least one of the horizontal gradient or the vertical gradient.

According to some embodiments, the central channel portion 107 increases depletion in the channel 115 and improves a substrate slope junction as compared to a channel that lacks a central channel portion. In some embodiments, the channel 115 comprising the central channel portion 107 improves electrostatic control as compared to a channel that lacks a central channel portion. In some embodiments, the channel 115 comprising the central channel portion 107 and the radial channel portion 113 has increased voltage threshold tuning as compared to a channel that lacks a central channel portion and a radial channel portion. In some embodiments, increased voltage threshold tuning comprises more accurately predicting a voltage requirement to turn a transistor "on." In some embodiments, a voltage threshold is adjustable by at least one of increasing or decreasing the central channel width 109b. In some embodiments, increased voltage threshold tuning reduces peak power or ground bouncing noise by more accurately matching a voltage applied to a gate of a transistor and the voltage requirement to turn a transistor "on."

According to some embodiments, a semiconductor device comprises a first active region and a channel adjacent the first active region. In some embodiments, the channel has a channel doping profile. In some embodiments, the channel comprises a central channel portion having a first dopant concentration of a first dopant and a radial channel portion surrounding the central channel portion, the radial channel portion having a second dopant concentration of a second dopant greater than the first dopant concentration. In some embodiment, a second active region is adjacent the channel.

According to some embodiments, a method of forming a semiconductor device comprises forming a first column over a first active region, forming a doped layer comprising a second dopant over the first column, and forming a channel having a channel doping profile. In some embodiments, forming the channel comprises forming a central channel portion comprising at least some of the first column having a first dopant concentration and forming a radial channel portion surrounding the central channel portion comprising at least one of the doped layer or at least some of the first column, such that the radial channel portion has a second dopant concentration of the second dopant, the second dopant concentration greater than the first dopant concentration.

According to some embodiments, a semiconductor device comprises a first active region is adjacent the channel. In some embodiments, the channel has a channel doping profile. In some embodiments, the channel comprises a central channel portion having a first dopant concentration of a first dopant and a radial channel portion surrounding the central channel portion, the radial channel portion having a second dopant concentration of a second dopant greater than the first dopant concentration. In some embodiments, a second active region is adjacent the channel. In some embodiments, a gate surrounds the channel, where a ratio of a radial channel width of the radial channel portion divided by a central channel width of the central channel portion is between about 0.05 to about 5.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
    forming a first column over a first active region;
    forming a doped layer over the first column;
    forming a channel having a channel doping profile, comprising:
        forming a central channel portion comprising at least some of the first column and having a first dopant concentration; and
        after forming the doped layer, forming a radial channel portion surrounding the central channel portion and comprising at least one of the doped layer or at least some of the first column, such that the radial channel portion has a second dopant concentration, the second dopant concentration greater than the first dopant concentration; and
    forming a second active region over and in contact with the channel after forming the doped layer and after forming the channel having the channel doping profile.

2. The method of claim 1, wherein forming the channel comprises performing a thermal process at a first temperature between about 500° C. and about 800° C. for a first duration between about 1 sec and about 75 min.

3. The method of claim 2, comprising adjusting at least one of the first temperature or the first duration to generate the channel doping profile, where the channel doping profile comprises at least one of a step doping profile, a linear doping profile or a Gaussian doping profile.

4. The method of claim 1, comprising forming a gate around the channel after forming the doped layer and after forming the channel having the channel doping profile.

5. The method of claim 4, wherein forming the gate comprises:
    forming a gate dielectric around the channel; and
    forming a gate electrode around the gate dielectric.

6. A method of forming a semiconductor device, comprising:
    forming a first layer comprising a first doping concentration;
    forming a second layer over the first layer and comprising a second doping concentration less than the first doping concentration;
    etching the second layer and a portion of the first layer to define a column;
    forming a doped layer to surround a sidewall of the column and over a top surface the column, wherein a concentration of dopant within the doped layer is greater than the second doping concentration;
    forming a first insulating layer over the doped layer, wherein a portion of a sidewall of the doped layer remains exposed after forming the first insulating layer;
    forming a gate dielectric over the first insulating layer and over a top surface of the doped layer; and
    forming a gate electrode to surround the sidewall of the doped layer after forming the gate dielectric.

7. The method of claim 6, wherein forming the doped layer comprises epitaxially growing the doped layer over the first layer, around the sidewall of the column, and over the top surface of the column.

8. The method of claim 6, comprising:
etching the gate dielectric to expose the top surface of the doped layer; and
forming a second active region over the top surface of the doped layer after etching the gate dielectric.

9. The method of claim 8, wherein etching the gate dielectric comprises etching the gate dielectric to expose a second portion of the sidewall of the doped layer and forming the second active region comprises forming the second active region to contact the second portion of the sidewall.

10. The method of claim 6, comprising:
etching the gate dielectric and the gate electrode to expose a second portion of the sidewall of the doped layer;
forming a second insulating layer over the gate electrode and adjacent the second portion of the sidewall of the doped layer; and
forming a second active region over the second insulating layer, wherein the second insulating layer is disposed between the gate electrode and the second active region.

11. A method of forming a semiconductor device, comprising:
forming a first layer comprising a first doping concentration;
forming a second layer over the first layer and comprising a second doping concentration less than the first doping concentration;
etching the second layer and a portion of the first layer to define a column;
forming a doped layer to surround a sidewall of the column and over a top surface the column, wherein a concentration of dopant within the doped layer is greater than the second doping concentration;
forming a gate electrode to surround a sidewall of the doped layer;
etching the gate electrode to expose a portion of the sidewall of the doped layer;
forming a first insulating layer over the gate electrode and adjacent the portion of the sidewall of the doped layer; and
forming a second active region over the first insulating layer, wherein the first insulating layer is disposed between the gate electrode and the second active region.

12. The method of claim 11, wherein forming the doped layer comprises epitaxially growing the doped layer over the first layer, around the sidewall of the column, and over the top surface of the column.

13. The method of claim 11, comprising:
forming a gate dielectric over a top surface of the doped layer; and
etching the gate dielectric to expose the top surface of the doped layer prior to forming the second active region.

14. The method of claim 13, wherein forming the second active region comprises forming the second active region over the top surface of the doped layer.

15. The method of claim 13, wherein etching the gate dielectric comprises etching the gate dielectric to expose the portion of the sidewall of the doped layer.

16. The method of claim 11, wherein forming the second active region comprises forming the second active region to contact the sidewall of the doped layer.

17. The method of claim 11, comprising:
forming a gate dielectric prior to forming the gate electrode, wherein forming the first insulating layer comprises forming the first insulating layer to contact the gate dielectric.

18. The method of claim 11, wherein forming the first insulating layer comprises forming the first insulating layer to contact a top surface of the gate electrode.

19. The method of claim 18, wherein forming the first insulating layer comprises forming the first insulating layer to contact a sidewall of the gate electrode.

20. The method of claim 11, comprising:
forming a second insulating layer over the doped layer prior to forming the gate electrode; and
forming a gate dielectric over the second insulating layer prior to forming the gate electrode.

* * * * *